США010454016B2

(12) United States Patent
Fong et al.

(10) Patent No.: US 10,454,016 B2
(45) Date of Patent: Oct. 22, 2019

(54) NUMBER-RESOLVING PHOTON DETECTOR WITH GRAPHENE-INSULATING-SUPERCONDUCTING JUNCTION

(71) Applicant: RAYTHEON BBN TECHNOLOGIES CORP., Cambridge, MA (US)

(72) Inventors: Kin Chung Fong, Lexington, MA (US); Thomas A. Ohki, Arlington, MA (US)

(73) Assignee: Raytheon BBN Technologies Corp., Cambridge, MA (US)

( * ) Notice: Subject to any disclaimer, the term of this patent is extended or adjusted under 35 U.S.C. 154(b) by 0 days.

(21) Appl. No.: 15/983,928

(22) Filed: May 18, 2018

(65) Prior Publication Data

US 2018/0337324 A1 Nov. 22, 2018

Related U.S. Application Data

(60) Provisional application No. 62/509,027, filed on May 19, 2017.

(51) Int. Cl.
*H01L 31/0304* (2006.01)
*H01L 39/24* (2006.01)
(Continued)

(52) U.S. Cl.
CPC ............ *H01L 39/2493* (2013.01); *G01J 5/20* (2013.01); *H01L 31/0352* (2013.01);
(Continued)

(58) Field of Classification Search
CPC ......... H01L 31/02327; H01L 31/03044; H01L 31/0352; H01L 39/223; H01L 39/228; H01L 39/2493
See application file for complete search history.

(56) References Cited

U.S. PATENT DOCUMENTS 9,425,377 B2 8/2016 Moyerman et al.
9,577,176 B1 2/2017 Fong et al.
(Continued)

OTHER PUBLICATIONS

Dean, C.R. et al., "Boron nitride substrates for high-quality graphene electronics", Nature Nanotechnology, Oct. 2010, pp. 722-726, vol. 5, Macmillan Publishers Limited.
(Continued)

*Primary Examiner* — Cuong Q Nguyen
(74) *Attorney, Agent, or Firm* — Lewis Roca Rothgerber Christie LLP

(57) ABSTRACT

A photon detector including a graphene-insulating-superconducting junction configured as a temperature sensor. Photons are absorbed by the graphene sheet of the graphene-insulating-superconducting junction, each absorbed photon causing a temporary increase in the temperature of the graphene sheet, and a corresponding change in the differential impedance of the graphene-insulating-superconducting junction. The graphene-insulating-superconducting junction is part of a resonant circuit connected as a shunt load between a radio frequency input transmission line and a radio frequency output transmission line. The transmission S-parameter from input to output is affected by the impedance of the resonant circuit which in turn is affected by the differential impedance of the graphene-insulating-superconducting junction, and therefore by the temperature of the graphene sheet. The absorption of photons is detected by detecting changes in the transmission S-parameter indicating temperature changes caused by the absorption of a photon.

20 Claims, 8 Drawing Sheets

(51) Int. Cl.
  *H01L 39/22* (2006.01)
  *H01L 31/0352* (2006.01)
  *G01J 5/20* (2006.01)
  *H01L 39/10* (2006.01)

(52) U.S. Cl.
  CPC ............ *H01L 39/10* (2013.01); *H01L 39/223* (2013.01); *H01L 39/228* (2013.01)

(56) References Cited

U.S. PATENT DOCUMENTS

| | | | |
|---|---|---|---|
| 9,666,743 B2 | 5/2017 | Fong et al. | |
| 2016/0372622 A1* | 12/2016 | Fong | H01L 31/03044 |
| 2017/0088944 A1* | 3/2017 | Sultana | C23C 16/26 |
| 2018/0190854 A1* | 7/2018 | Bower | H01L 31/03521 |

OTHER PUBLICATIONS

Gasparinetti, S. et al., "Fast Electron Thermometry for Ultrasensitive Calorimetric Detection", Physical Review Applied, 2015, pp. 014007-1 through 014007-7, vol. 3, American Physical Society.

Ullom, J.N., "Physics and Applications of Nis Junctions", Lawrence Livermore National Laboratory, Aug. 2001, 8 pages, U.S. Department of Energy.

Walsh, Evan D. et al., "Graphene-based Josephson junction single photon detector", Phys. Rev. Applied, Mar. 4, 2017, 12 pages.

Wang, L. et al., "One-Dimensional Electrical Contact to a Two-Dimensional Material", Science, Nov. 1, 2013, pp. 614-617, vol. 342.

\* cited by examiner

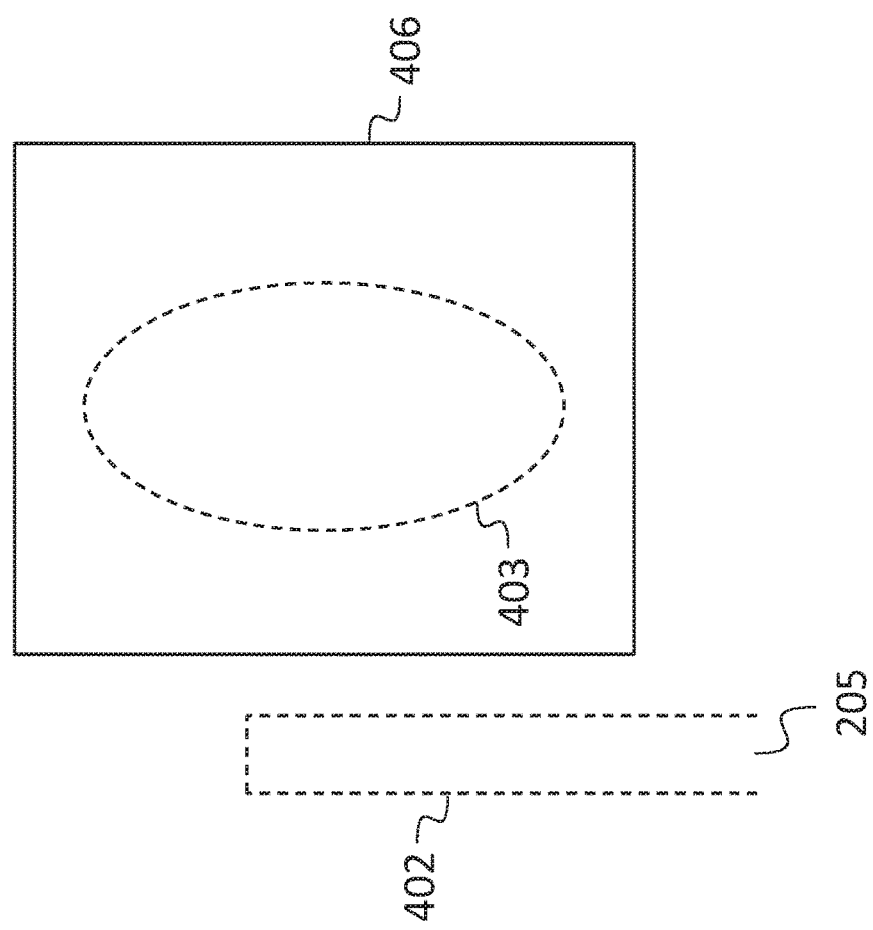

NUMBER-RESOLVING PHOTON DETECTOR WITH GRAPHENE-INSULATING-SUPERCONDUCTING JUNCTION

CROSS-REFERENCE TO RELATED APPLICATION(S)

The present application claims priority to and the benefit of U.S. Provisional Application No. 62/509,027, filed May 19, 2017, entitled "GRAPHENE-INSULATING-SUPERCONDUCTOR (GIS) READOUT FOR A NUMBER RESOLVING SINGLE PHOTON DETECTOR", the entire content of which is incorporated herein by reference.

FIELD

One or more aspects of embodiments according to the present invention relate to photon detectors, and more particularly to a photon detector including a graphene-insulating-superconducting junction.

BACKGROUND

Detection of low-photon-flux signals at microwave frequencies or at infrared wavelengths has various commercial applications, including communications, radar and LiDAR, and other remote sensing applications. Related art detectors may lack sensitivity or may be costly. Moreover, related art detectors may lack the capability to bridge the gap effectively between a photon-counting mode, and a mode in which the detector measures a mean photon flux rate, of a relatively high photon flux. In the case of low photon flux, related art detectors may also lack of the energy-resolving capability, i.e. measuring the photon energy of individual photons under detection.

Thus, there is a need for an improved photon detector.

SUMMARY

Aspects of embodiments of the present disclosure are directed toward a photon detector including a graphene-insulating-superconducting junction configured as a temperature sensor. Photons are absorbed by the graphene sheet of the graphene-insulating-superconducting junction, each absorbed photon causing a temporary increase in the temperature of the graphene sheet, and a corresponding change in the differential impedance of the graphene-insulating-superconducting junction. The graphene-insulating-superconducting junction is part of a resonant circuit connected as a shunt load between a radio frequency input transmission line and a radio frequency output transmission line. The transmission S-parameter from input to output is affected by the impedance of the resonant circuit which in turn is affected by the differential impedance of the graphene-insulating-superconducting junction, and therefore by the temperature of the graphene sheet. The absorption of photons is detected by detecting changes in the transmission S-parameter indicating temperature changes caused by the absorption of a photon.

According to an embodiment of the present disclosure there is provided a photon detector, having a sensing input for receiving photons, and including: a graphene-insulating-superconducting junction including a graphene sheet; and a sensing circuit, connected to the graphene-insulating-superconducting junction, for measuring a differential resistance of the graphene-insulating-superconducting junction, the graphene sheet being configured to undergo, when a photon is absorbed by the graphene sheet, an increase in temperature and a subsequent decrease in temperature, resulting in corresponding changes in the differential resistance of the graphene-insulating-superconducting junction.

In one embodiment, the sensing circuit includes: an interrogation circuit connected to the graphene-insulating-superconducting junction; and a receiver circuit connected to the graphene-insulating-superconducting junction, the interrogation circuit being configured: to generate an inbound radio frequency signal, and to feed the inbound radio frequency signal to the graphene-insulating-superconducting junction, the receiver circuit being configured to receive an outbound radio frequency signal from the graphene-insulating-superconducting junction.

In one embodiment, the sensing circuit further includes a resonant circuit including the graphene-insulating-superconducting junction.

In one embodiment, the resonant circuit includes a tank circuit, and the tank circuit is connected in parallel with the graphene-insulating-superconducting junction.

In one embodiment, the resonant circuit has a resonant frequency and a bandwidth, and the interrogation circuit is configured to generate a sequence of pulses, each pulse having a frequency differing from the resonant frequency by less than the bandwidth.

In one embodiment, the sequence of pulses has a pulse repetition rate greater than or equal to the reciprocal of a thermal time constant of the graphene sheet.

In one embodiment, the sequence of pulses has a pulse repetition rate at least ten times greater than or equal to the reciprocal of the thermal time constant of the graphene sheet.

In one embodiment, the photon detector is configured to detect photons absorbed by the graphene sheet from changes in a transmission S-parameter, from the interrogation circuit to the receiver circuit, resulting from temperature changes in the graphene sheet caused by the absorption of the photons.

In one embodiment, the photon detector includes an impedance-matching element connected between the sensing input and the graphene-insulating-superconducting junction.

In one embodiment, the impedance-matching element is a quarter-wave section of transmission line.

In one embodiment, the photon detector includes: a first bias tee; and a second bias tee, the first bias tee being connected between the interrogation circuit and the graphene-insulating-superconducting junction; and the second bias tee being connected between the receiver circuit and the graphene-insulating-superconducting junction.

In one embodiment, the first bias tee includes a first coupling capacitor having a first capacitance, the second bias tee includes a second coupling capacitor having a second capacitance, and the second capacitance is greater than the first capacitance.

In one embodiment, the graphene-insulating-superconducting junction includes a superconducting metal layer; and the graphene-insulating-superconducting junction has: a first contact connected to: the graphene sheet, the first bias tee, and the second bias tee; and a second contact connected to the superconducting metal layer of the graphene-insulating-superconducting junction, the second contact being connected to ground.

In one embodiment, the graphene-insulating-superconducting junction has a sensing contact connected to the sensing input.

In one embodiment, the sensing contact is the first contact.

In one embodiment, the sensing contact is a contact, separate from the first contact, formed at an edge of the graphene sheet.

In one embodiment, the photon detector includes: a first layer of hexagonal boron nitride immediately adjacent a first surface of the graphene sheet, and a second layer of hexagonal boron nitride immediately adjacent a second surface of the graphene sheet.

In one embodiment, each of the first layer of hexagonal boron nitride and the second layer of hexagonal boron nitride has a thickness greater than 1 nm and less than 1 micron.

In one embodiment, the graphene sheet consists of a single atomic layer of graphene.

In one embodiment, the graphene sheet includes two atomic layers of graphene.

BRIEF DESCRIPTION OF THE DRAWINGS

Features, aspects, and embodiments are described in conjunction with the attached drawings, in which:

FIG. 4 is a schematic illustration of a system for coupling optical photons from an optical waveguide to a graphene sheet, according to an embodiment of the present invention.

DETAILED DESCRIPTION

The detailed description set forth below in connection with the appended drawings is intended as a description of exemplary embodiments of a photon detector with a graphene-insulating-superconducting junction provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1A:
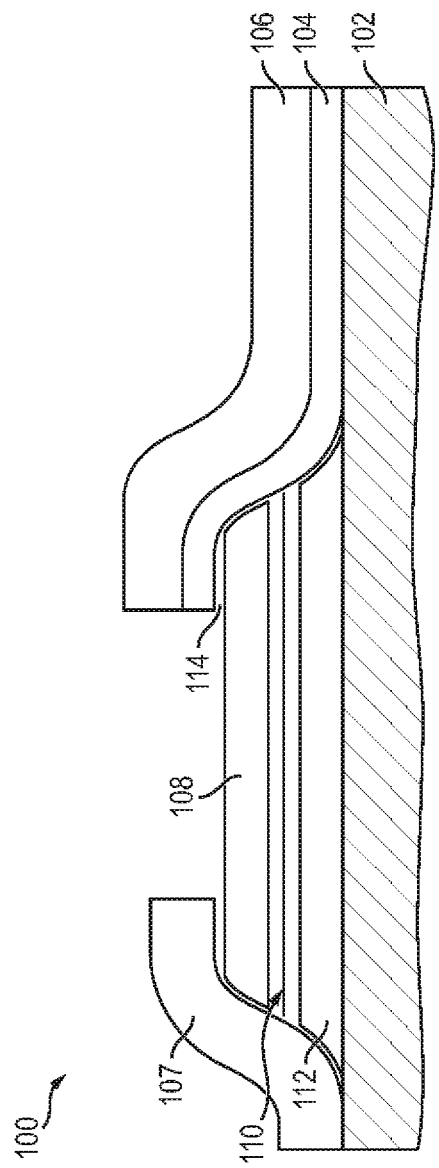
FIG. 1A is a schematic illustration of a graphene-insulating-superconducting junction, according to an embodiment of the present invention.
Figure 1B:
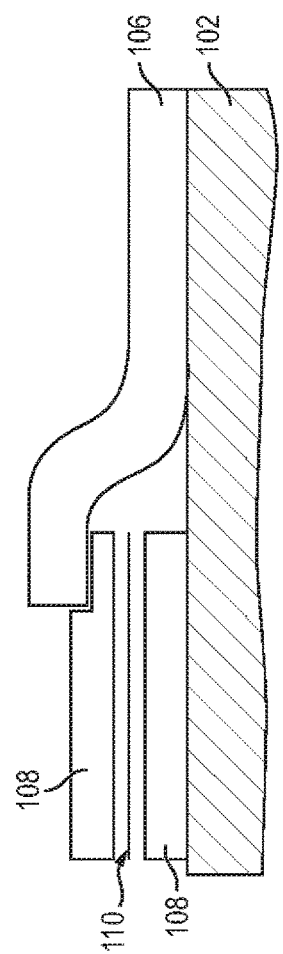
FIG. 1B is a schematic illustration of a graphene-insulating-superconducting junction, according to an embodiment of the present invention.
Figure 1C:
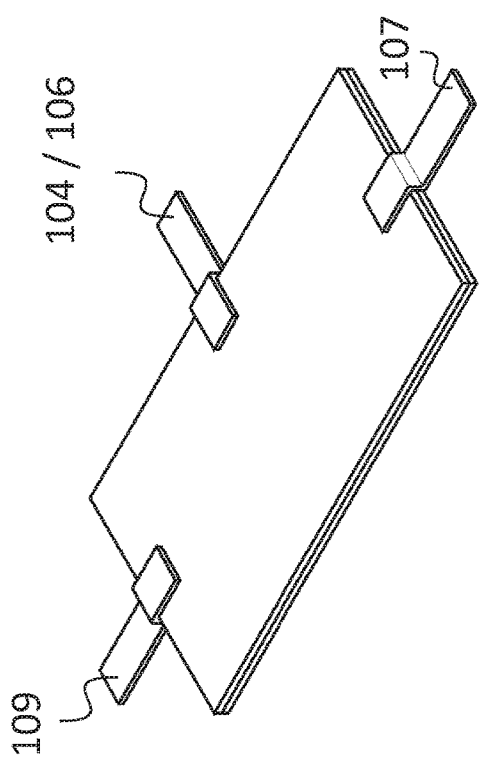
FIG. 1C is a schematic perspective view of a graphene-insulating-superconducting junction, according to an embodiment of the present invention.

Referring to FIG. 1A, a graphene-insulating-superconducting junction 100 may include a graphene sheet 110 sandwiched between two layers 108, 112 of hexagonal boron nitride, and a superconducting metal layer 106, separated from the sandwich by an insulating layer 104. The superconducting metal may be aluminum, for example, and the insulating layer may be composed of aluminum oxide, for example. The graphene-insulating-superconducting junction may be constructed on a substrate 102. The thickness of each of the hexagonal boron nitride layers 108, 112 may be in the range of 1 nm to 100 nm, e.g., the thickness may be 30 nm. The thickness of graphene sheet 110 may be 1 atomic layer, or a small number of atomic layers (e.g., 2, 3, or 4 layers). The junction contact of the graphene edge 114 is a one-dimensional contact or a contact made via the overlapping surface (two-dimensional). The insulating part of the junction can also simply be either the hexagonal boron nitride or the other insulating oxide material as mentioned above. The superconducting metal layer 106 may be composed of superconducting aluminum, and the insulating layer 104 may be aluminum oxide. The graphene-insulating-superconducting junction may be a two-terminal device, with one terminal being the superconducting metal layer 106 and the other terminal being the graphene sheet 110 (to which a connection may be made using, for example, an additional edge contact). In other embodiments the graphene sheet may have two or more additional edge contacts. For example, one or two edge contacts, 107 and 109, may be used to feed photons (e.g., microwave photons), by the oscillating voltages and currents due to the microwave or tera-hertz wave, to the graphene sheet 110 for detection (one contact if the current return path is through the graphene-insulating-superconducting junction (e.g., if the photons are fed in on an unbalanced transmission line), or two contacts if the current return path is separate, e.g., if the photons are fed in on a balanced transmission line), and one edge contact may be used to feed an inbound radio frequency signal to the graphene-insulating-superconducting junction to measure its differential resistance, as described in further detail below. FIG. 1B shows an embodiment in which the insulating portion of the graphene-insulating-superconducting junction 100 is not an additional element but is instead part of the upper hexagonal boron nitride layer 108, which is locally thinned to provide a suitable thickness for quantum tunneling. FIG. 1C is a perspective view in one embodiment, in which the combination of an insulating layer and superconducting metal layer (104/106), or a superconducting metal layer 106 (with a separate insulating element, as shown for example in FIG. 1B), forms a graphene-insulator-superconductor junction. The circuit can be closed by superconductor or metal contact 107, whereas the superconductor or metal contact 109 can be used for the coupling of electromagnetic photons into the detector.

In operation, the junction may be cooled to a temperature at which the metal layer 106 is superconducting; the graphene sheet may remain normal (i.e., non-superconducting). Like other normal-insulating-superconducting junctions, the graphene-insulating-superconducting junction may exhibit a current-voltage characteristic that is diode-like; in particular the current through the junction may be proportional to the product of (i) the square root of the absolute temperature of the normal element (i.e., the graphene element) of the graphene-insulating-superconducting junction and (ii) an exponential function of (a) the voltage across the junction, divided by (b) the absolute temperature of the graphene element of the graphene-insulating-superconducting junction. In some embodiments the temperature of the superconducting element of the graphene-insulating-superconducting junction does not significantly affect the current-voltage characteristic of the graphene-insulating-superconducting junction. As, such, when the graphene-insulating-superconducting junction is operated in a biased condition (e.g., with a bias voltage applied to the grapheneinsulating-superconducting junction, resulting in a bias current flowing through the graphene-insulating-superconducting junction), the small signal resistance (or "differential resistance") of the graphene-insulating-superconducting junction is a function both of the bias voltage, and of the absolute temperature of the graphene element of the graphene-insulating-superconducting junction. In some embodiments, under suitable bias conditions, the differential resistance decreases with an increasing electron temperature in the graphene.

Figure 2A:
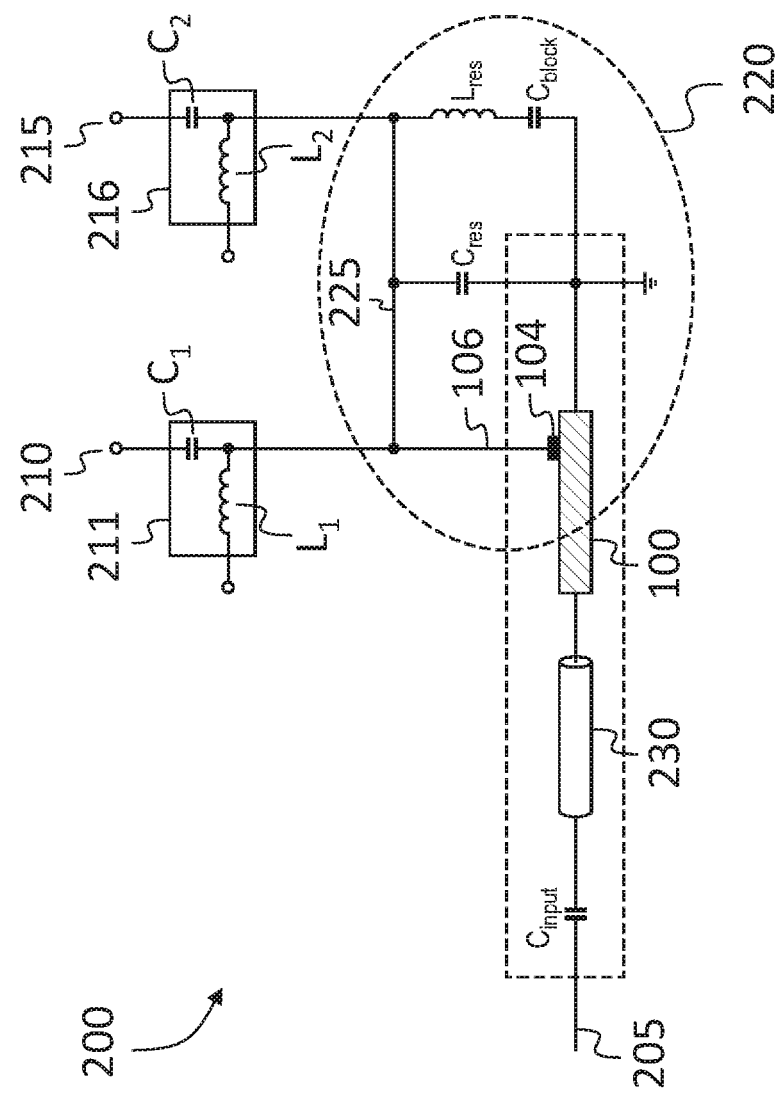
FIG. 2A is a schematic diagram of a sensing head, according to an embodiment of the present invention.
Figure 2B:
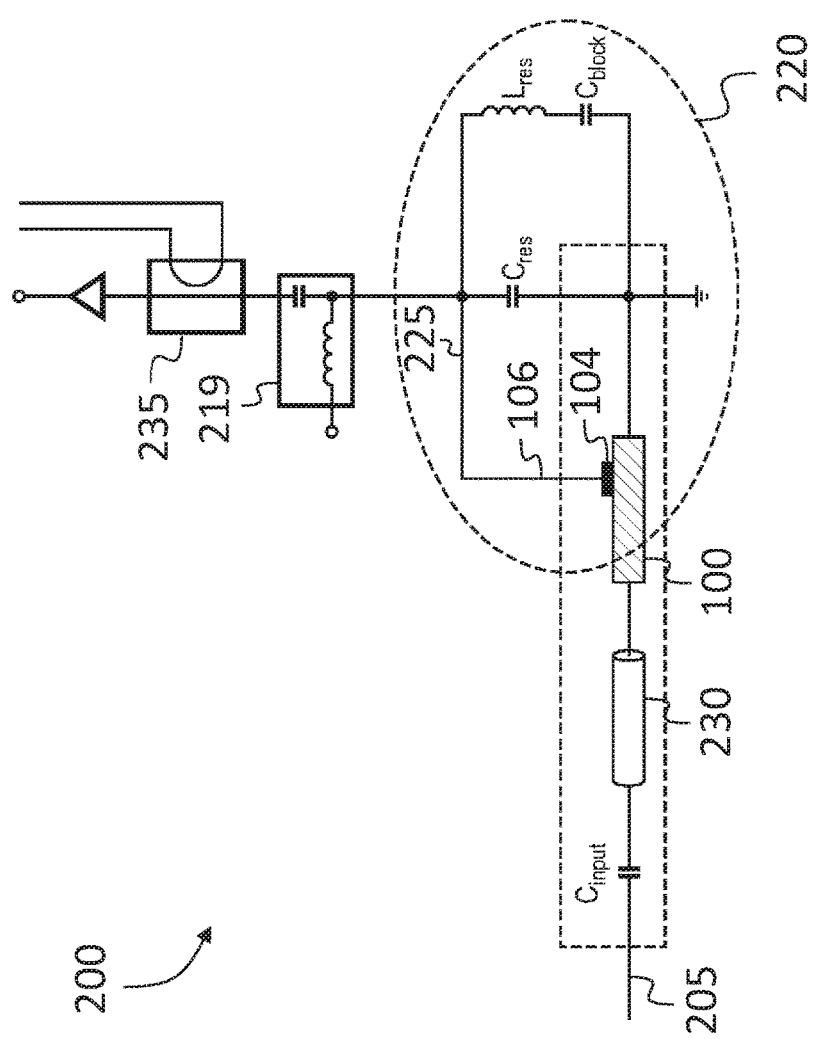
FIG. 2B is a schematic diagram of a sensing head, according to an embodiment of the present invention.
Figure 2C:
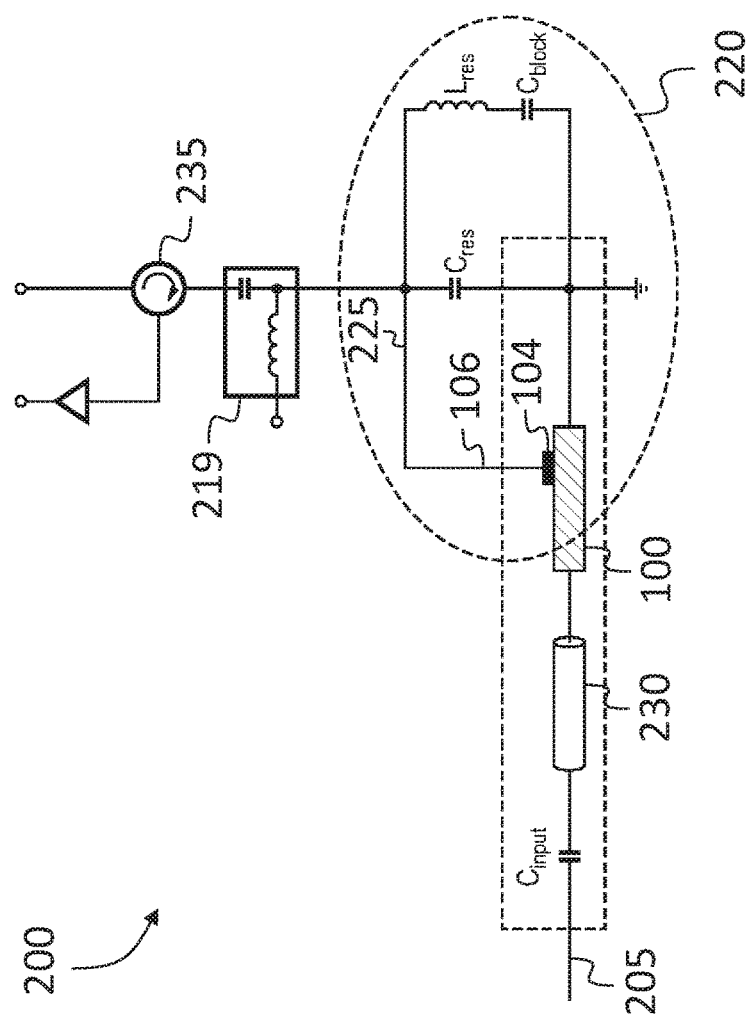
FIG. 2C is a schematic diagram of a sensing head, according to an embodiment of the present invention.

Referring to FIG. 2A, the sensing head 200 of a photon detector with a graphene-insulating-superconducting junction has an input for photons to be sensed, or "sensing input" 205, an interrogating input 210, and a receiver output 215. This embodiment is an exemplary to detect a change of differential resistance of the GIS junction from the change of impedance of microwave resonator. A interrogating input bias tee 211 and a receiver output bias tee 216 are connected at the interrogating input 210, and at the receiver output 215, respectively. The interrogating input bias tee 211 includes a capacitor $C_1$ and an inductor $L_1$ and the receiver output bias tee 216 includes a capacitor $C_2$ and an inductor $L_2$. The graphene-insulating-superconducting junction 100 is part of a resonant circuit 220, which forms a shunt connection to ground from a common terminal 225. Alternatively, one can combine the interrogating bias tee and receiving bias tee into a single bias tee 219, as in a microwave reflectometry measurement setup, as illustrated in FIG. 2B and FIG. 2C. In such a case, a directional coupler 235 (FIG. 2B) or a circulator (FIG. 2C) can be connected at the RF port of the single bias tee 219, to direct the microwave pulse traffic. The resonant circuit 220 includes the graphene-insulating-superconducting junction, connected in parallel with a tank circuit. As used herein, a "tank circuit" is the parallel combination of an inductor and a capacitor, or such a circuit including other elements (such as the large capacitor $C_{block}$) that do not significantly affect its resonant characteristics.

In operation, an inbound radio frequency signal is received at the interrogating input 210, and transmitted, as an outbound frequency signal, through the receiver output 215. The amplitude and phase of the outbound radio frequency signal, relative to the amplitude and phase of the inbound radio frequency signal, depends on the impedance of the resonant circuit 220, from the common terminal to ground. In particular, the relative amplitude (i.e., the magnitude of the transmission S-parameter $S_{21}$) may be given by $$|S_{21}| = \frac{G_0}{G + G_0}$$

where $G_0 = 4\pi^2 Z_0 f_0^2$ and G is the differential conductance of the graphene-insulating-superconducting junction 100 (i.e., the reciprocal of the differential resistance), $Z_0$ is the characteristic impedance at the interrogating input 210 and at the receiver output 215, $f_0$ is the resonant frequency of the resonant circuit 220, and the bias tees are assumed to have no effect (i.e., having sufficiently large capacitors and inductors that their impedances are much less and much greater, than $Z_0$, respectively). If the capacitors $C_1$, $C_2$ of the bias tees are not sufficiently large to have a negligible effect on the transmission S-parameter $S_{21}$, then their values may be taken into account by using instead the following expressions:

$$|S_{21}| = 2\kappa \frac{G_0}{G + G_0} \text{ and}$$

$$G_0 = 4\pi^2(C_1^2 + C_2^2)Z_0 f_0^2,$$

where $\kappa = C_1 C_2/(C_1^2 + C_2^2)$.

The blocking capacitor $C_{block}$ is inserted to block the DC bias current which in the absence of this capacitor would flow through the resonant inductor $L_{res}$. The capacitance of the blocking capacitor $C_{block}$ may be sufficiently large that at the resonant frequency of the resonant circuit 220 the impedance of the blocking capacitor $C_{block}$ is negligible compared to the impedance of the resonant inductor $L_{res}$, i.e., $\omega_{res} L_{res} \gg 1/(\omega_{res} C_{block})$, where $\omega_{res}$ is the resonant frequency of the resonant circuit 220. The resonant frequency of the resonant circuit 220 may be given by $\omega_{res}^2 = 1/(L_{res} C_{res})$. The resonant frequency of the resonant circuit 220 may be about 600 MHz for example, and the bandwidth of the resonant circuit 220 may be about 60 MHz for example. Higher resonant frequency and wider bandwidth are possible to allow shorter interrogation pulse and higher repetition rate.

The impedance of the resonant circuit 220, from the common terminal to ground, depends on the differential resistance of the graphene-insulating-superconducting junction, which, in turn, depends on the absolute temperature of the graphene element of the graphene-insulating-superconducting junction. When a photon is received through the sensing input 205 and absorbed by the graphene sheet, it causes a rapid increase in temperature, and the temperature then decays with the thermal time constant of the graphene sheet. As such, measurements of the transmission S-parameter $S_{21}$ (or a continuous measurement of the transmission S-parameter $S_{21}$), during the time of elevated electron temperature in the graphene may be used to detect the arrival of photons at the sensing input 205.

The electron temperature of the graphene sheet may be out of equilibrium with the temperature of the lattice of the graphene sheet. It is primarily the electron temperature that is affected by the absorption of a photon, and it is primarily the electron temperature (not the temperature of the lattice) that influences the differential impedance of the graphene-insulating-superconducting junction. Accordingly, the term "absolute temperature" as used herein refers to the absolute temperature of the electrons of the graphene element of the graphene-insulating-superconducting junction, i.e., the absolute temperature of the electrons of the graphene sheet.

The thermal time constant of the graphene sheet may be about 1 microsecond, and may be larger or smaller depending on the operating temperature. If a first photon is absorbed by the graphene sheet and an additional, second photon is then absorbed by the graphene sheet while the temperature of the graphene sheet remains elevated from the absorption of the first photon, the maximum absolute temperature attained after the absorption of the second photon will be greater than it would have been had only one photon been absorbed. Photons that are separated in time by less than the thermal time constant of the graphene sheet may be referred to herein as "overlapping" photons. Accordingly, the detection of a higher maximum absolute temperature may be used, by the photon detector, to infer that more than one photon was absorbed. Other methods for detecting the absorption of multiple photons in a short time interval may also be used, as described in further detail below.

The sensing input 205 may have a coupling capacitor $C_{input}$ connected to it, followed by a quarter-wave transmission line 230, which may be connected to the graphene-insulating-superconducting junction. The characteristic impedance of the quarter-wave transmission line 230 may be selected to be equal to the geometric mean of (i) the characteristic impedance at the sensing input 205 and (ii) the effective impedance of the circuit to which the output of the quarter-wave transmission line 230 is connected. The effective impedance of the circuit to which the output of the quarter-wave transmission line 230 is connected may be equal to the parallel combination of (i) the resonant impedance of the resonant circuit 220, from the common terminal 225 to ground, (ii) the impedance of the series combination of (a) the capacitor $C_1$ of the interrogation input bias tee 211 and (b) the characteristic impedance at the interrogating input 210, and (iii) the impedance of the series combination of (a) the capacitor $C_2$ of the receiver output bias tee 216 and (b) the characteristic impedance at the receiver output 215. As such, the quarter-wave transmission line 230 may perform an impedance-matching function, reducing reflections at the sensing input 205 which otherwise would reduce the detection efficiency of the photon detector.

Figure 3:
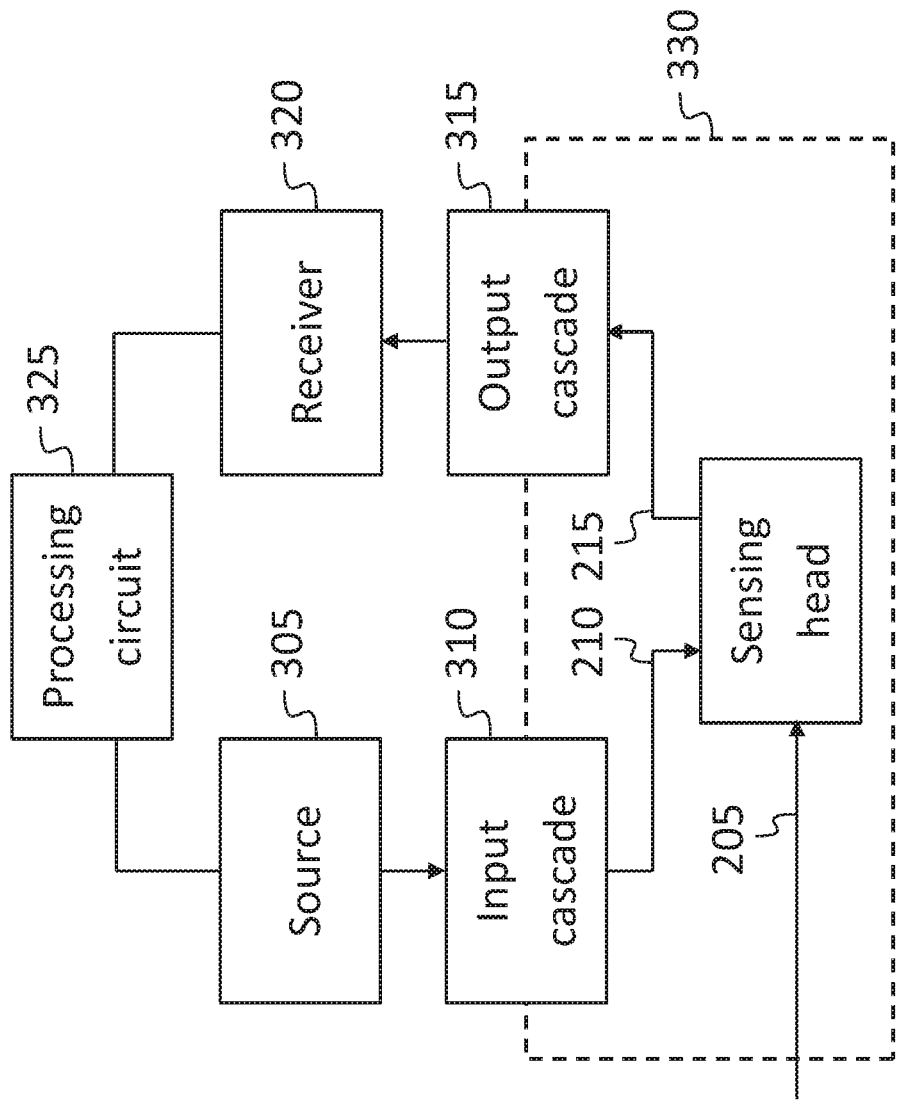
FIG. 3 is a block diagram of a photon detector with a graphene-insulating-superconducting junction, according to an embodiment of the present invention.

Referring to FIG. 3, the photon detector with a graphene-insulating-superconducting junction may include, in addition to the sensing head 200, a radio frequency source 305 for generating the inbound radio frequency signal, an input cascade 310 for feeding the inbound radio frequency signal to the sensing head 200, an output cascade 315 for feeding the outbound radio frequency signal out of the sensing head 200, a receiver 320 for receiving the outbound radio frequency signal, basically measuring the amplitude and phase of the reflected or transmitted microwave pulse, a processing circuit 325, and a cryogenic system 330. As such, the sensing head 200, the radio frequency source 305, the receiver 320 input cascade 310, the output cascade 315 and the processing circuit 325 together form a sensing circuit for sensing temperature changes in the graphene sheet 110 and for detecting photons.

The cryogenic system 330 may include an insulated container and a cooling system for maintaining the sensing head 200 at a sufficiently low temperature that the metal layer 106 remains in a superconducting state. The radio frequency source 305 may be any source suitable for generating the inbound radio frequency signal, which may be, for example, a single continuous tone, or a sequence of pulses. The pulses may have a frequency falling within, e.g., centered within, the bandwidth of the resonant circuit 220. The pulse repetition rate may be comparable to the thermal time constant of the graphene sheet, to avoid missing photons that otherwise may produce a temperature response sufficiently brief to fall between pulses. In other embodiments the pulse repetition rate may be significantly higher, for example, it may be ten times the reciprocal of the thermal time constant of the graphene sheet, or, for example, it may be 60 MHz, to make possible the detection of multiple photons even when they are separated by sufficiently short time intervals that their temperature responses overlap, for example, when one photon is absorbed at a point in time following the absorption of a previously absorbed photon by less than the thermal time constant of the graphene sheet.

The input cascade 310 may include, connected in a cascade, one or more attenuators, each at a successively lower temperature, so that an attenuator in the cascade (at a first temperature) may attenuate thermal noise from the preceding attenuator (which is at a higher temperature than the first temperature) while emitting thermal noise at a lower level corresponding to the first temperature. In this manner, heating of the graphene sheet 110 by electrical signals traveling through the input cascade 310 may be reduced. Further, for the same reason, the capacitance of the capacitor of the first bias tee 211 may be selected to be smaller than the capacitance of the capacitor of the second bias tee 216, and the capacitance of the capacitor of the first bias tee 211 may be selected to be sufficiently small to reflect a substantial fraction of the inbound thermal noise.

The output cascade 315 may include, connected in a cascade, zero or more attenuators, zero or more circulators, and zero or more amplifiers, to preserve the outbound radio frequency signal and to reduce both reflections back to the graphene-insulating-superconducting junction and backward-propagating thermal noise, either of which may, if not suppressed, heat the graphene sheet 110. The amplifiers may be low-noise amplifiers, e.g., high electron mobility transistor (HEMT) amplifiers.

The receiver 320 may include a circuit configured to receive the outbound radio frequency signal, and to convert it to digital samples, for analysis by the processing circuit. For example, it may include a local oscillator and a mixer for converting the frequency of the received signal to a lower-frequency intermediate frequency signal, which may more readily be converted to digital form, by an analog to digital converter in the receiver.

The processing circuit 325 may calculate the transmission S-parameter from the digitized samples it receives from the receiver 320 and, from it, the temperature response during any measurement interval. In the case of a design with a single bias tee (as in, e.g., FIG. 2B or 2C), the reflection S-parameter may be analyzed instead of the transmission S-parameter. It may then count the number of photons received, and/or measure the respective energies of the photons received. The photon detector may be used for various commercial applications including communications, radar, imaging, and quantum computing.

In some embodiments the processing circuit 325 may infer the temperature based on only the magnitude of the transmission S-parameter (by inverting the equations above); in other embodiments the processing circuit 325 may use both the magnitude and the phase of the transmission S-parameter to estimate the temperature. The relationship between the temperature and the phase of the transmission S-parameter may be derived analytically, or it may be measured, by adjusting the temperature (in the absence of photons at the sensing input 205) and observing the phase of the transmission S-parameter. During this process the temperature may be estimated using the magnitude of the transmission S-parameter.

As used herein, a "temperature response" or "temperature response function" is a representation of the temperature of the graphene-insulating-superconducting junction as a function of time. It may be represented, for example, by an array of numbers each representing a temperature at a corresponding sampling time, or it may be an algorithm that generates an expected temperature offset (from the equilibrium operating temperature of the graphene-insulating-superconducting junction) for two parameters, (i) the elapsed time since the absorption of the photon, and (ii) the energy of the photon. Such an algorithm may return a temperature offset that is equal to zero for time values that are less than zero and, for time values that are greater than zero it may return a decaying exponential proportional to the energy of the photon, with a time constant equal to the thermal time constant of the graphene sheet.

In some embodiments the energy of an absorbed photon may be estimated from the temperature response it generates. For example, a higher energy (shorter wavelength)

photon may cause a larger temperature increase. A measurement of the maximum temperature during a time window including the absorption time of the photon may, for example, be used to estimate the energy of the absorbed photon, or the sampled temperature response (sampled, for example, once by each of a series of pulses generated by the radio frequency source 305 and received by the receiver 320) may be fit with a modeled (or measured) template temperature response function corresponding to the absorption of a single photon.

In some embodiments, the photon detector may be capable both of detecting (i.e., counting) individual non-overlapping photons, or small numbers of overlapping photons as described above; it may also be capable of detecting photon fluxes that are sufficiently large that identification and counting of individual photons is impractical. In the latter mode of operation, the processing circuit may infer the mean power in the received photon flux from the increase in the mean temperature of the graphene sheet 110, measured by measuring the transmission S-parameter.

This template response function may be parameterized by the absorption time of the photon and by the photon energy, so that fitting the measured temperature response function by adjusting these two parameters for the best fit may result in estimates of the absorption time of the photon and its energy (the estimated values being the best fit values of the corresponding parameters). In some embodiments, the absorption time and energy of each of a plurality of absorbed photons, with temperature responses overlapping in time, may be estimated by fitting, to the measured temperature response, a superposition of template response functions, the absorption time and photon energy of each template response function being an adjustable parameter, the fitting consisting of adjusting the adjustable parameters for a best fit to the measured temperature response.

In some embodiments the photons being detected are microwave photons each with a frequency in the range from 6 GHz to 8 GHz. Each such photon may be received from a quantum data processing element that may be referred to as a quantum bit, or also known as Qubit. The absorption (or the absence of an absorption) of a photon from the Qubit may be an indication of the state of the Qubit (i.e., whether it is in "1" state or a "0" state). Although there should be no strict limit on the frequency of the input microwave photon in some embodiments, the sensitivity of the detector may be limited by the operating temperature of the graphene, and other operational parameters.

In some embodiments changes in the differential resistance of the graphene-insulating-superconducting junction may be measured otherwise, for example, by applying a constant bias (voltage or current) to the graphene-insulating-superconducting junction and detecting (with an amplifier having sufficient bandwidth to resolve the thermal time constant of the graphene sheet) the changes in current or voltage that result when a photon is absorbed.

In some embodiments, the constant voltage and/or current bias is a set-point of the detector. The interrogation-output pulse is a fast measurement that probes the number of the photons within a time window. Similar to a shutter in a traditional camera: the film is ready to accept photons like the suitably biased resonator. The pulse convolved with the thermal time constant of the electrons in graphene may similarly define the time-window (in a manner analogous to that of a camera shutter)

The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed wiring board (PWB) or distributed over several interconnected PWBs. A processing circuit may contain other processing circuits; for example a processing circuit may include two processing circuits, an FPGA and a CPU, interconnected on a PWB.

The sensing head 200 may be modified as shown in FIG. 4 to detect shorter wavelength photons, e.g., infrared photons. The photons are received at the sensing input 205 (which is an optical input in the embodiment of FIG. 4) through an optical waveguide 402 (which may be a photonic crystal waveguide) and coupled to an optical resonator 403 (which may be a a photonic crystal cavity). The optical waveguide 402 and the optical resonator 403 may be fabricated in a substrate (e.g., a silicon substrate) and evanescent waves from the resonator 403 may couple to the graphene sheet 406, which may be on a surface of the substrate, above the resonator 403. In this embodiment, the graphene-insulating-superconducting junction may be part of a resonant circuit in a sensing head as illustrated in FIG. 2A, and the sensing head may be part of a photon detector as illustrated in FIG. 3.

Although limited embodiments of a photon detector with a graphene-insulating-superconducting junction have been specifically described and illustrated herein, many modifications and variations will be apparent to those skilled in the art. Accordingly, it is to be understood that a photon detector with a graphene-insulating-superconducting junction employed according to principles of this invention may be embodied other than as specifically described herein. The invention is also defined in the following claims, and equivalents thereof.

What is claimed is:

1. A photon detector, having a sensing input for receiving photons, and comprising:
   a graphene-insulating-superconducting junction comprising a graphene sheet; and
   a sensing circuit, connected to the graphene-insulating-superconducting junction, for measuring a differential resistance of the graphene-insulating-superconducting junction,
   the graphene sheet being configured to undergo, when a photon is absorbed by the graphene sheet, an increase in temperature and a subsequent decrease in temperature, resulting in corresponding changes in the differential resistance of the graphene-insulating-superconducting junction.

2. The photon detector of claim 1, wherein the sensing circuit comprises:
   an interrogation circuit connected to the graphene-insulating-superconducting junction; and
   a receiver circuit connected to the graphene-insulating-superconducting junction,
   the interrogation circuit being configured:
     to generate an inbound radio frequency signal, and
     to feed the inbound radio frequency signal to the graphene-insulating-superconducting junction, the receiver circuit being configured to receive an outbound radio frequency signal from the graphene-insulating-superconducting junction.

3. The photon detector of claim 2, wherein the sensing circuit further comprises a resonant circuit comprising the graphene-insulating-superconducting junction.

4. The photon detector of claim 3, wherein:
the resonant circuit comprises a tank circuit, and
the tank circuit is connected in parallel with the graphene-insulating-superconducting junction.

5. The photon detector of claim 3, wherein:
the resonant circuit has a resonant frequency and a bandwidth, and
the interrogation circuit is configured to generate a sequence of pulses,
each pulse having a frequency differing from the resonant frequency by less than the bandwidth.

6. The photon detector of claim 5, wherein the sequence of pulses has a pulse repetition rate greater than or equal to the reciprocal of a thermal time constant of the graphene sheet.

7. The photon detector of claim 6, wherein the sequence of pulses has a pulse repetition rate at least ten times greater than or equal to the reciprocal of the thermal time constant of the graphene sheet.

8. The photon detector of claim 5, wherein the photon detector is configured to detect photons absorbed by the graphene sheet from changes in a transmission S-parameter, from the interrogation circuit to the receiver circuit, resulting from temperature changes in the graphene sheet caused by the absorption of the photons.

9. The photon detector of claim 5, further comprising an impedance-matching element connected between the sensing input and the graphene-insulating-superconducting junction.

10. The photon detector of claim 9, wherein the impedance-matching element is a quarter-wave section of transmission line.

11. The photon detector of claim 2, further comprising:
a first bias tee; and
a second bias tee,
the first bias tee being connected between the interrogation circuit and the graphene-insulating-superconducting junction; and
the second bias tee being connected between the receiver circuit and the graphene-insulating-superconducting junction.

12. The photon detector of claim 11, wherein:
the first bias tee comprises a first coupling capacitor having a first capacitance,
the second bias tee comprises a second coupling capacitor having a second capacitance, and
the second capacitance is greater than the first capacitance.

13. The photon detector of claim 11, wherein:
the graphene-insulating-superconducting junction comprises a superconducting metal layer; and
the graphene-insulating-superconducting junction has:
a first contact connected to:
the graphene sheet,
the first bias tee, and
the second bias tee; and
a second contact connected to the superconducting metal layer of the graphene-insulating-superconducting junction,
the second contact being connected to ground.

14. The photon detector of claim 13, wherein the graphene-insulating-superconducting junction has a sensing contact connected to the sensing input.

15. The photon detector of claim 14, wherein the sensing contact is the first contact.

16. The photon detector of claim 14, wherein the sensing contact is a contact, separate from the first contact, formed at an edge of the graphene sheet.

17. The photon detector of claim 1, comprising:
a first layer of hexagonal boron nitride immediately adjacent a first surface of the graphene sheet, and
a second layer of hexagonal boron nitride immediately adjacent a second surface of the graphene sheet.

18. The photon detector of claim 17, wherein each of the first layer of hexagonal boron nitride and the second layer of hexagonal boron nitride has a thickness greater than 1 nm and less than 1 micron.

19. The photon detector of claim 1, wherein the graphene sheet consists of a single atomic layer of graphene.

20. The photon detector of claim 1, wherein the graphene sheet comprises two atomic layers of graphene.

* * * * *